(12) United States Patent
Chang et al.

(10) Patent No.: US 6,294,448 B1
(45) Date of Patent: Sep. 25, 2001

(54) METHOD TO IMPROVE TISIX SALICIDE FORMATION

(75) Inventors: Tzong-Sheng Chang, Chang-Hua; Hung-Chi Tsai, Dai Liao Village; Bor-Zen Tien, Shang-Shung Village, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/483,932

(22) Filed: Jan. 18, 2000

(51) Int. Cl.7 .................... H01L 21/44; H01L 21/3205; H01L 21/4763
(52) U.S. Cl. ............................ 438/592; 438/682
(58) Field of Search .................... 438/301, 241, 438/257, 258, 425, 14, 592, 682

(56) References Cited

U.S. PATENT DOCUMENTS

| | | | |
|---|---|---|---|
| 5,635,746 | 6/1997 | Kimura et al. | 257/382 |
| 5,656,519 | 8/1997 | Mogami | 438/303 |
| 5,739,573 | 4/1998 | Kawaguchi | 257/384 |
| 5,780,333 | 7/1998 | Kim | 438/238 |
| 5,834,811 | 11/1998 | Huang | 257/336 |
| 5,863,820 | 1/1999 | Huang | 438/241 |
| 5,891,771 | 4/1999 | Wu et al. | 438/248 |
| 5,982,017 | * 11/1999 | Wu et al. | 257/513 |
| 5,998,252 | * 12/1999 | Huang | 438/241 |
| 6,004,843 | * 12/1999 | Huang | 438/241 |
| 6,015,730 | * 1/2000 | Wang et al. | 438/241 |
| 6,037,222 | * 3/2000 | Huang et al. | 438/257 |
| 6,074,915 | * 6/2000 | Chen et al. | 438/258 |
| 6,080,638 | * 6/2000 | Lin et al. | 438/425 |
| 6,096,595 | * 8/2000 | Huang | 438/238 |
| 6,165,807 | * 12/2000 | Lee et al. | 438/18 |

\* cited by examiner

*Primary Examiner*—John F. Niebling
*Assistant Examiner*—Walter L. Lindsay, Jr.
(74) *Attorney, Agent, or Firm*—George O. Saile; Stephen B. Ackerman

(57) ABSTRACT

A new method is provided for the formation of silicided layers over points of electrical contact that are required in MOSFET devices. The structure of the MOSFET gate electrode is formed, including LDD regions, gate spacers and source/drain regions. A layer of Resist Protective Oxide (RPO) is deposited over the structure and patterned leaving the RPO in place where the silicided layers are not to be formed and exposing surfaces on which salicided layers are to be formed. These surfaces are the surfaces of the substrate overlying the source and drain regions and the surface of the gate electrode. An extra As or $BF_2$ implant is performed into the surface of the exposed regions after which the process of salicidation is performed following conventional processing steps.

27 Claims, 3 Drawing Sheets

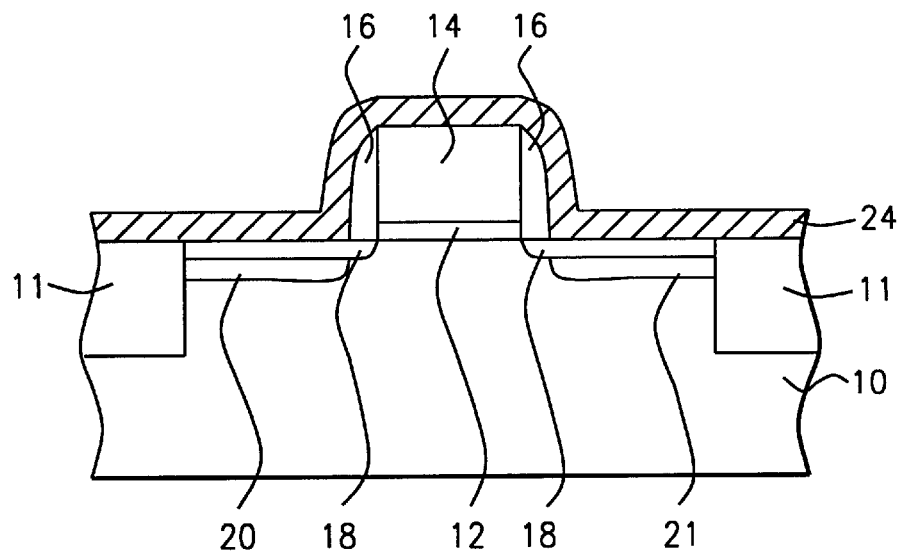
FIG. 1 – Prior Art
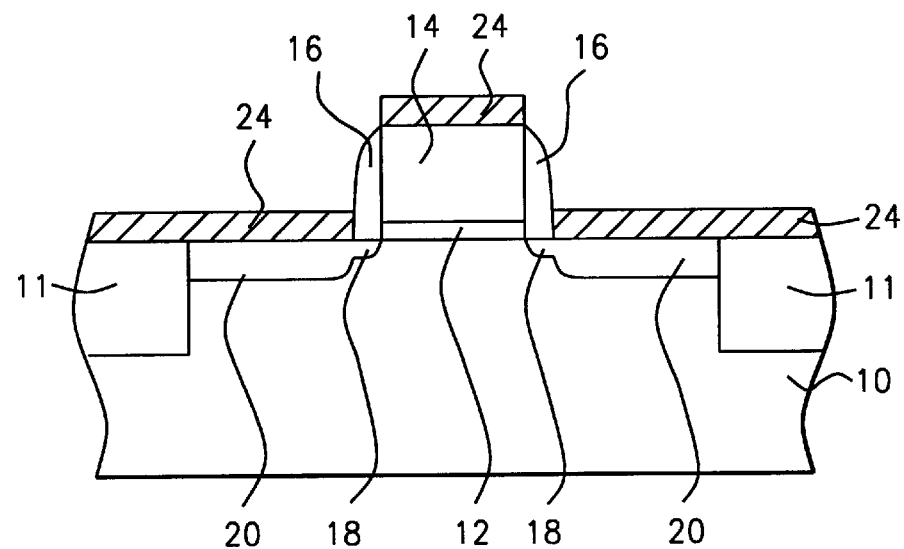
FIG. 2 – Prior Art

METHOD TO IMPROVE TISIX SALICIDE FORMATION

BACKGROUND OF THE INVENTION (1) Field of the Invention

The invention relates to the fabrication of integrated circuit devices, and more particularly, to a method to improve $TiSi_x$ salicide formation by adding an extra As or $BF_2$ implant after Resist Protection Oxide (RPO) etching.

(2) Description of the Prior Art

The category of semiconductor devices that is commonly referred to as Field Effect Devices (FET's) forms an important class of devices that has, as a consequence, received a considerable amount of attention in its construction and the many refinements that have been applied to this construction. The main thrust of the refinements that have been applied to these devices has been provided by the continued decrease in device size that has led to continued device improvements. In its simplest form, the FET consists of a gate electrode structure, typically formed of polysilicon, that is formed on the surface of a layer of gate oxide that has been deposited on the surface of a semiconductor substrate. Self-aligned with and adjacent to the gate electrode are two regions in the surface of the substrate of opposite conductivity type that are referred to as the source and the drain regions. Points of electrical contact are established to the source and drain regions in addition to the surface region of the gate electrode.

With the continued decrease in device dimensions, it has become increasingly more important to find solutions to problems that are caused by misalignments between the successive mask patterns that are applied to create FET devices. It is for instance of great importance that the source and drain regions are in good alignment with the gate electrode, it is also of great importance that regions to which electrical contacts are to be established are in good alignment in order to assure electrical isolation and the avoidance of electrical shorts between these regions. By using the body of the gate electrode as a mask during ion implantation for the creation of the source and drain regions, good alignment can be obtained for these regions. To separate the source/drain contacts from the contact that is established with the surface of the gate electrode, gate spacers are created on the sidewalls of the gate electrode. To further reduce contact resistance with the points of electrical contact of the gate electrode, these contact regions are salicided. This is accomplished by forming a silicide film of a metal that has a high melting point on these surfaces. A titanium silicide film is mainly used as the high melting point silicide film while cobalt silicide and nickel silicide film have also been investigated. The basic success of forming salicided contact layers can be achieved due to the fact that certain metals, such as titanium or cobalt, react when heated while they are in contact with silicon. This reaction forms conductive silicides over the surface of the silicon while the metal however does not react with silicon oxides. By forming silicon oxide spacers on the sidewalls of the gate electrode, the deposited metal does not interact with the sidewalls of the gate electrode and separate points of electrical contact can be formed for the source/drain regions and the surface of the gate electrode.

For the operation of a FET device, an electrical voltage is applied between the source and the drain regions. Very little current will flow as a result of this electrical voltage because one of the two interfaces (PN junctions) that exist between the underlying silicon substrate and the source/drain regions will always be back biased. The region of the silicon substrate that exists underneath the gate electrode can however be electrically controlled (biased) such that the minority carriers that are present in this region (the channel region) are increased to a level that is sufficiently high such that this region assumes the same conductivity type as the source/drain regions and, as a consequence, current can flow more freely. Improved FET device performance is achieved by reducing the channel length of the device while simultaneously keeping the resistance between the channel region and the source/drain regions as high as possible. The latter objective is accomplished by the introduction of Lightly Doped Drain (LDD) regions that extend from both sides of the gate electrode with a very light (and not deep) implant into the surface of the substrate.

The formation of an n-type channel MOS device that has salicided source/drain contacts in addition to salicided gate electrode will be detailed below. FIG. 1 shows a cross section of a p-type semiconductor surface 10, field isolation regions 11 of thick oxide have been provided in the surface of the substrate to define the active regions in the surface of the substrate. A thin layer 12 of gate oxide has been formed using methods of thermal oxidation, a layer 14 of polysilicon is deposited over the surface of the gate oxide layer 12, this layer 14 of poly is provided with a n-type conductivity and patterned to form to body of the gate electrode. The etch that is required to form the body of the gate electrode removes the deposited layer of poly and the deposited layer of gate oxide in accordance with the pattern of the gate electrode. An n-type ion implant 18 is performed into the surface of the substrate, this implant is self-aligned with the body 14 of the gate electrode and forms the LDD regions of the gate electrode. The gate spacers 16 are next formed by a thermal deposition of a layer of silicon nitride over the surface of the gate electrode and its surrounding area, the layer 16 of silicon nitride is anisotropically etched back thereby forming the gate spacers 16 on the sidewalls of the gate electrode. A second, relatively deep and heavily doped n-type implant 20/21 is performed into the surface of the substrate 10 to form the source and drain regions 20/21 of the gate electrode 14. The region 18 of the LDD region is now concentrated under the spacers 16 of the gate electrode. The next step in the process is the step of forming contacts with the gate electrode source (20) and drain (21) regions and the surface of the gate electrode 14. A layer 24 of refractory metal is blanket deposited over the entire structure. The structure that is shown in FIG. 1 is subjected to a heat treatment that causes layer 24 to react with the underlying layer 14 of poly and the underlying surface of the source and drain regions 20 and 21 whereby this layer of refractory metal 24 is fully converted to a silicide. The unreacted refractory metal has not formed silicide and is therefore removed by applying a selective etch that essentially removes the metal from the surface of the gate electrode spacers 16 leaving the silicided metal in place over the surface of the source 20 and drain 21 regions in addition to leaving the silicided metal in place over the surface of the gate electrode 14. A cross section of the gate structure after the process of removing the unreacted refractory metal has been removed from the structure is shown in FIG. 2 where the layers 24 form the points of electrical contact to the gate electrode and the source and drain regions of this gate electrode.

During present salicidation processing, the processing step of depositing the layer 24 of refractory metal is preceded by an silicon ion implant into the surface of the substrate 10 in order to improve the formation of the silicided layers 24. The results that are achieved by the silicon ion implant depend on this implant being performed in regions that have previously been subjected to the LDD and source/region implants of either n-type or p-type impurities. Where these implants for the LDD or source/drain regions have even minor misalignments and where therefore the silicon surface has an impurity concentration that is not uniform (the silicon surface contains intrinsic silicon devoid of a uniform impurity profile), the silicon ion implant that precedes that deposition of the refractory metal does not produce the desired salicidation of the deposited layer of refractory metal and therefore results in poor salicide formation over the regions of electrical contacts for the source and drain regions. The invention addresses this problem and provides a method of negating effects of inaccurate LDD and source/drain implants on the salicidation of the overlying layer of refractory metal.

U.S. Pat. No. 5,863,820 (Huang) shows a Salicide process using a RPO layer. However, this reference differs from the invention. The process of this invention addresses applications whereby logic and memory devices share the same chip. Contacts to the logic circuits are made applying the salicide process, thus assuring high performance. The layer of Resist Protection Oxide (RPO) is applied to the memory side to allow the salicide process to be selectively applied to the logic side. The process of this invention of applying the RPO is not aimed at achieving improvements in the salicidation process.

U.S. Pat. No. 5,891,771 (Wu et al.) shows a salicide and STI process. However, this reference differs from the invention. This invention addresses the formation of a recessed structure for shallow trench isolation and for the salicidation process.

U.S. Pat. No. 5,834,811 (Huang), U.S. Pat. No. 5,656,519 (Mogami), U.S. Pat. No. 5,635,746 (Kimura et al.), U.S. Pat. No. 5,780,333 (Kim) and U.S. Pat. No. 5,739,573 (Kawaguchi) show other salicide processes.

SUMMARY OF THE INVENTION

A principle objective of the invention is to provide a method that eliminates poor salicidation results when forming points of electrical contacts for semiconductor devices thereby improving the process of salicidation.

Yet another objective of the invention is to compensate for the occurrence of intrinsic polysilicon and silicon surfaces in the formation of silicided layers in semiconductor devices.

In accordance with the objectives of the invention a new method is provided for the formation of silicided layers over points of electrical contact that are required in MOSFET devices. The structure of the MOSFET gate electrode is formed, including LDD regions, gate spacers and source/drain regions. A layer of Resist Protective Oxide (RPO) is deposited over the structure and patterned leaving the RPO in place where the silicided layers are not to be formed and exposing surfaces on which salicided layers are to be formed. These surfaces are the surfaces of the substrate overlying the source and drain regions and the surface of the gate electrode. An extra As or $BF_2$ implant is performed into the surface of the exposed regions after which the process of salicidation is performed following conventional processing steps.

BRIEF DESCRIPTION OF THE DRAWINGS

FIG. 1 shows a cross section of a Prior Art MOSFET gate electrode formation up through the deposition of a layer of refractory metal that is used to form silicided points of electrical contact.

FIG. 2 shows the cross section of FIG. 1 after the salicided layers have been formed over the points of electrical contact.

FIG. 5 shows a cross section of a silicon surface that is processed in accordance with the process of the invention, as follows:

The sequence of the FIGS. 5a through 5e is followed by a step of removal of the unreacted Ti from the surface followed by a second thermal anneal of the surface for the completion of the process of the invention.

DESCRIPTION OF THE PREFERRED EMBODIMENTS

Silicides are often used to reduce contact resistance. For very small modern silicon devices, which are sub-micron, sub-half-micron, and even sub-quarter-micron, conventional photolithographic technique for patterning contacts will not meet the required tolerance of critical dimensions. The method of self-aligned silicide (salicide) formation, which self-registers with the contacts at the top of the polysilicon gate, the source and the drain, helps solve the problem of critical dimension tolerance. Salicides have thus become almost universal in today's high-density MOSFET (Metal-Oxide-Semiconductor Field-Effect Transistors) devices even though the gate metal is now prevalently replaced by the polysilicon gate. Metal silicide can be polysilicon deposited using a furnace, at a temp. between 400 and 600 degrees C. to a thickness between 1500 and 2500 Angstrom and can be titanium silicide formed by depositing PVD titanium and annealing to form thin layers of titanium silicide ($TiSi_2$) over the polysilicon gate and the source/drain regions in a temperature range of between 600 and 750 degrees C. for a time of between 20 and 40 seconds and then rapid thermal annealing in a temperature of between about 800 and 900 degrees C. for a time between 20 and 40 seconds.

The process of the invention can be applied to any process of semiconductor fabrication where salicided layers of $TiSi_x$ are created. Static Random Access Memory (SRAM) cells are now being fabricated using high speed, high-density CMOS devices. Conventional SRAM devices are usually configured using either four n-channel and two p-channel MOSFET devices or using four n-channel and two resistor load devices. Due to the complexity of these devices, the devices require considerably surface area. To decrease the need for area on the surface of a substrate, the Self Aligned Contact (SAC) approach has been developed. This approach uses a SAC opening in a dielectric layer that exposes underlying source or drain regions. The ability to efficiently use the SAC structure depends on the ability to reduce the resistance at the interface between the overlying polycide structure and the top surface of the source and drain regions that are exposed in the SAC opening.

Figure 3:
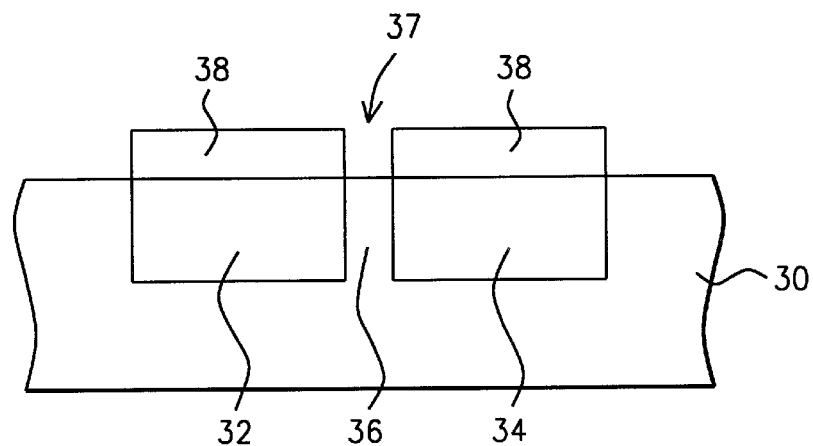
FIG. 3 shows a cross section of Prior Art formation of impurity implants whereby these implants are not aligned thereby creating a non-uniform implant profile.

Referring now specifically to FIG. 3, there is shown a cross section of a semiconductor surface 30 into which an n-type implant 32 and a p-type implant 34 have been performed. The main point to be observed from the cross section that is shown in FIG. 3 is that the two implants 32 and 34 are not immediately adjacent to each other but are separated by a space 36. This lack of immediate adjacency of the two implants 32 and 34 results in an impurity profile in the surface 30 that is non-uniform and disrupted by the distance 36 between the implants. This disruption causes a molecular lattice structure within the surface 30 that is unpredictable and discontinuous and that provides a poor basis for the formation of the silicided layer 38 of the refractory metal titanium salicide. The silicided layer 38 will be interrupted by a region 37, that is the region that aligns with and overlays the disruption 36 between the two impurity implants 32 and 34. The process of salicidation will form a poor silicided layer of titanium salicide in the region 37 for reasons that have been stated above.

The conventional processing steps that are associated with the formation of a FET device on the surface of a substrate are detailed below. These steps have been placed between quotation marks where these steps will be modified by the process of the invention. This modification is in addition to the introduction of the invention of an extra As or $BF_2$ implant that subsequently will be highlighted. The processing steps are as follows:

forming Shallow Trench Isolation regions in the surface of the substrate thereby electrically isolating the active regions of the substrate growing a layer of gate oxide over the surface of the substrate depositing a layer of polysilicon over the layer of gate oxide patterning and etching the layer of polysilicon thereby forming the poly gate structure thereby leaving in place the poly for the gate structure and the underlying layer of gate oxide performing light implants of n-type/p-type impurities into the surface of the substrate thereby forming self-aligned LDD regions immediately adjacent to the gate electrode structure forming gate spacers on the sidewalls of the gate electrode structure performing heavy implants of n-type/p-type impurities into the surface of the substrate thereby forming self-aligned source and drain regions immediately adjacent to the gate electrode structure depositing a layer of Resist Protective Oxide (RPO) over the structure patterning and etching the deposited layer of RPO thereby removing the RPO where silicided layers need to be formed, "the RPO etch applied is a time-mode etch"

performing a pre-metal wet-etch dip depositing a layer a refractory metal containing titanium performing a silicon ion mixing implant into the surface of the substrate performing a first Rapid Thermal anneal thereby forming titanium silicide over the surface that are not protected by the deposited RPO removing unreacted titanium performing a second Rapid Thermal anneal thereby transforming the layer of titanium silicide over the source and drain regions from the high resistivity phase to the low resistivity phase depositing a layer of Inter Level Dielectric (ILD) over the structure thereby including the layers of titanium silicide patterning and etching the deposited layer of ILD thereby forming openings through the layer of ILD to the layers of titanium silicide whereby these openings align with the created layers of titanium silicide depositing a layer of metal over the surface of the layer of ILD thereby including the openings created in the layer of ILD planarizing the layer of deposited metal, and patterning and etching the deposited layer of metal thereby establishing electrical contacts between electrical interconnect lines and the created layers of titanium silicide.

Typically the layer of RPO can be formed to a thickness of about 350 Angstrom through Chemical Vapor Deposition (CVD) at a temperature of about 400 degrees C. for a time period of about 10 to 20 seconds.

If the layer of RPO oxide contains TEOS oxide, the etch of the layer of RPO can be performed using etchant gas: $CF_4$ or $CHF_3$ at a flow rate of about 15 sccm, gas pressure about 800 mTorr, rf power density about 400 Watts, no magnetic field applied, wafer temperature about −17 degrees C., time of the etch about 10 seconds.

If the layer of RPO oxide contains silicon oxide ($SiO_x$) the etching of the layer of RPO can be formed using monosilane ($SiH_4$) and nitrous oxide ($N_2O$) as a source material deposited using LPCVD or PECVD procedures, at a temperature between about 300 and 800 degrees C., to a thickness between about 2000 and 5000 Angstrom.

Typical processing parameters for the above indicated first and second Thermal Anneal are as follows: the first RTA is a rapid thermal anneal in a temperature range of between 600 and 750 degrees C. for a time of between 20 and 40 seconds while the second RTA is a rapid thermal anneal in a temperature of between about 800 and 900 degrees C. for a time between 20 and 40 seconds.

The LDD implant forms the lightly doped regions for the source and drain regions of the MOS device. The LDD implant is performed using processing conditions that are determined by the type of device that is being created. For instance, if the device is a NMOS device, the implant uses arsenic or phosphorous with an energy within the range of between 5 to 60 keV and a dose within the range of between 1E14 to 1E15 atoms/$cm^2$. If the device is a PMOS device, the LDD implant uses $BF_2$ with an energy within the range of between 1 to 30 keV and a dose within the range of between 1E13 to 5E14 atoms/$cm^2$.

Spacers for gate electrodes can be made using a variety of materials such as silicide nitride, silicon oxide, BSG, PSG, other materials preferably of a dielectric nature, CVD oxide formed from a TEOS source. The preferred material that is used for the formation of gate electrode spacers is silicon nitride that is deposited over the surface of the gate oxide using thermal deposition procedures at a pressure between about 10 pA and 50 pA, at a temperature between about 600 and 800 degrees C., to a thickness between about 1000 and 2000 Angstrom. The silicon dioxide layer can also be deposited using thermal deposition procedures using a reactant gas mixture such as DCS and ammonia. The silicon oxide gate spacers are formed via anisotropic RIE of the deposited layer of silicon oxide layer, using $CHF_3/CF_4$ or $SF_6$—$O_2$ as an etchant.

Source and drain implants are also made under different processing conditions that are dependent on the requirements for the device that is being created. For instance a first conductivity imparting dopant using phosphorous can be implanted to create a lightly doped source and drain regions, ion implanted at an energy between about 5 to 60 KeV, at a dose between about 1E12 to 1E14 atoms/$cm^2$. A second conductivity imparting dopant can be used to create medium doped source and drain regions, such as arsenic or phosphorous, ion implanted at an energy between about 5 to 60 KeV, at a dose between about 1E13 to 5E14 atoms/$cm^2$. A third conductivity imparting dopant can be used to create heavily doped source and drain regions, such as arsenic, ion implanted at an energy between about 5 to 60 KeV, at a dose between about 1E15 to 5E15 atoms/$cm^2$.

Titanium is deposited on the exposed upper surfaces of the source/drain regions and the top surface of SiN of the gate region and annealed, thereby causing the titanium to react with the underlying silicon of the substrate source/drain regions to form titanium salicide on these surfaces. The layer of titanium can be deposited on the surface of the substrate to a thickness between about 300 to 600 $A^0$ at a temperature of 25 to 300 degrees C. using either rf. sputtering or CVD techniques.

The first anneal that is performed to the layer of titanium is typically a rapid thermal annealing in a temperature range of between about 600 and 800 degrees C. for a time between about 20 and 40 seconds in a nitrogen ambient.

The layer of titanium can be removed with an etchback using a wet $NH_4OH$ and $H_2O_2$ solution. A CVD titanium may also be etched using a dry $CF_4$ and oxygen environment.

The second anneal to transform layers of titanium silicide ($TiSi_2$) over the source/drain regions from the high resistivity phase to the low resistivity phase is a rapid thermal anneal in a temperature range of between about 800 and 900 degrees C. for a time between 20 and 40 seconds in an $N_2$ ambient.

Figure 4:
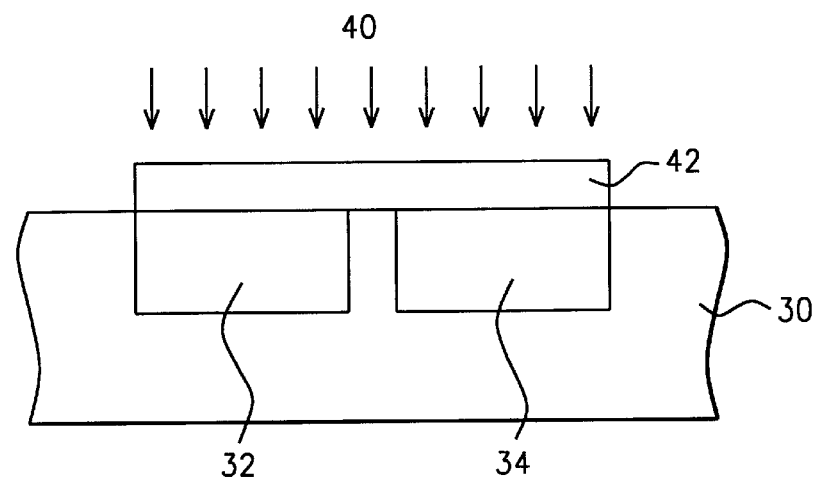
FIG. 4 shows a cross section of the extra implant of the invention that is applied to a surface whereby the impurity implants that have been performed are not aligned thereby creating a non-uniform implant profile.

FIG. 4 shows a cross section of the extra implant 40 of the invention that is applied to a surface whereby the impurity implants 32 and 34 that have been performed are not aligned thereby creating a non-uniform implant profile. Implants 34 and 36 are again separated by a distance 36. This lack of immediate adjacency of the two implants 32 and 34 results in an impurity profile in the surface 30 that is non-uniform and disrupted by the distance 36 between the implants. This disruption causes a molecular lattice structure within the surface 30 that is unpredictable and discontinuous and that provides a poor basis over which to form the silicided layer 38 of the refractory metal titanium salicide. The invention provides a method of eliminating the impact that the unpredictable and discontinuous impurity profile has on the formation of the overlying titanium salicide by providing an extra implant of either arsenic (As) or boron ($BF_2$) that forms a bridge between the impurity profiles of the two implants 32 and 34. In so doing, the invention provides a dependable method and a good surface over which to form the silicided layer 42 of the refractory metal titanium salicide.

The processing steps of the invention that are associated with the formation of a FET device on the surface of a substrate are detailed as follows, these steps have been placed between quotation marks where they have been modified by the process of the invention:

forming Shallow Trench Isolation regions in the surface of the substrate thereby electrically isolating the active regions of the substrate growing a layer of gate oxide over the surface of the substrate depositing a layer of polysilicon over the layer of gate oxide patterning and etching the layer of polysilicon thereby forming the poly gate structure thereby leaving in place the poly for the gate structure and the underlying layer of gate oxide performing light implants of n-type/p-type impurities into the surface of the substrate thereby forming self-aligned LDD regions immediately adjacent to the gate electrode structure forming gate spacers on the sidewalls of the gate electrode structure performing heavy implants of n-type/p-type impurities into the surface of the substrate thereby forming self-aligned source and drain regions immediately adjacent to the gate electrode structure depositing a layer of Resist Protective Oxide (RPO) over the structure patterning and etching the deposited layer of RPO thereby removing the RPO where silicided layers need to be formed, "the RPO etch applied is an time-mode etch"

"performing an extra arsenic (As) or boron ($BF_2$) implant"

performing a pre-metal wet-etch dip depositing a layer a refractory metal containing titanium performing a silicon ion mixing implant into the surface of the substrate performing a first Rapid Thermal anneal thereby forming titanium silicide over the surfaces that are not protected by the deposited RPO removing unreacted titanium performing a second Rapid Thermal anneal thereby transforming the layer of titanium silicide over the source and drain regions from the high resistivity phase to the low resistivity phase depositing a layer of Inter Level Dielectric (ILD) over the structure thereby including the layers of titanium silicide patterning and etching the deposited layer of ILD thereby forming openings through the layer of ILD to the layers of titanium silicide whereby these openings align with the created layers of titanium silicide depositing a layer of metal over the surface of the layer of ILD thereby including the openings created in the layer of ILD planarizing the layer of deposited metal, and patterning and etching the deposited layer of metal thereby establishing electrical contacts between electrical interconnect lines and the created layers of titanium silicide.

The processing conditions for the extra arsenic or boron implant can be experimentally determined and will vary between the processing conditions for the implant of LDD regions and the implant for the heavily doped source and drain regions. Typical processing conditions that can be applied are as follows.

A first impurity imparting dopant, used to create a lightly doped region, is arsenic or boron phosphorous, ion implanted at an energy between about 5 to 100 KeV, at a dose between about 1E11 to 1E14 atoms/cm$^2$.

A second conductivity imparting dopant, used to create a medium doped region, is arsenic or boron, ion implanted at an energy between about 5 to 50 KeV, at a dose between about 1E12 to 5E14 atoms/cm$^2$.

A third conductivity imparting dopant, used to create a heavily doped region, is arsenic or boron, ion implanted at an energy between about 5 to 150 KeV, at a dose between about 1E15 to 1E16 atoms/cm$^2$.

The preferred implants of the invention are implants of As or BF2 at an energy between about 5 to 50 KeV with the most preferred energy of 15 KeV and a dose between about 1E12 to 5E14 atoms/cm$^2$ with the most preferred dose at 1E14 atoms/cm$^2$.

The layer of RPO is formed to form a protective film that resists the overlaying layer of photoresist. The photoresist mask can be removed using sulfuric acid ($H_2SO_4$) and mixtures of $H_2SO_4$ with other oxidizing agents such as hydrogen peroxide ($H_2O_2$). A frequently used mixture for this purpose is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen.

The indicated silicon ion mixing implant into the surface of the substrate can be performed using arsenic or boron as a source, implanted under an energy of between about 5 and 20 KeV and a concentration between about 5 and 20 atoms/cm$^2$.

The above indicated step of performing a pre-metal wet dip uses the arsenic ion bombardment to clean the native oxide.

The RPO layer is etched after the RPO layer has been photo exposed. The dry etching further treats the RPO layer by ion bombardment.

While the above indicated typical impurity implant conditions have been limited to arsenic and boron, the process of the invention does not prevent the substitution of the p-type impurity of boron with other p-type impurities such as indium. The same can be said relating to substituting the n-type impurity of arsenic with other n-type impurities such as phosphorous.

FIG. 5 provides additional details regarding the process of the invention.

Figure 5A:
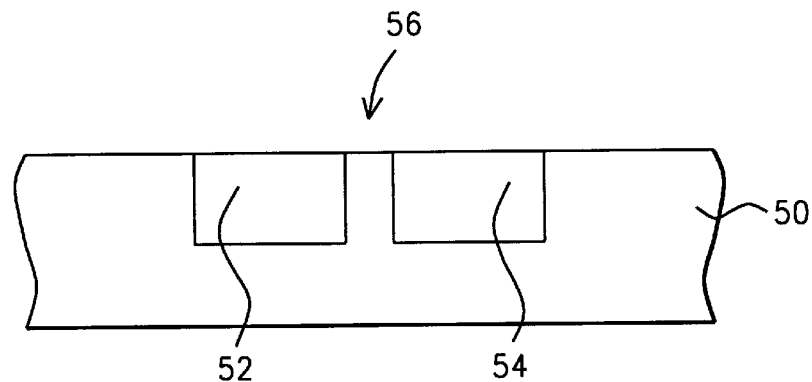
FIG. 5a shows a cross section of adjacent n and p-type implants that are not contiguous

FIG. 5a shows a cross section of adjacent n-type (52) and p-type (54) implants in the surface of a substrate 50, the implants are not contiguous which has been indicated by the distance 56 that exists between the two implants. This discontinuity or non-adjacency of implants can for instance occur where, in a n-well that has been created in the surface of a substrate for the formation of an overlying p-type FET, the p-type implant that is applied for the implants of the LDD or source/drain regions do not exactly align with the body of the gate electrode or with the gate spacers thereby leaving parts of the surface of the n-well without the implant and thereby exposing intrinsic silicon where the implant did not take place. The implants 52 and 54 than refer to implants that are made in the surface of the substrate for the LDD and/or source/drain regions and where these implants, although they are self-aligned with the gate electrode and the spacers of the gate electrode, are in fact not perfectly aligned and therefor provide imperfect or miss-aligned densities of impurities in the surface of the substrate.

Figure 5B:
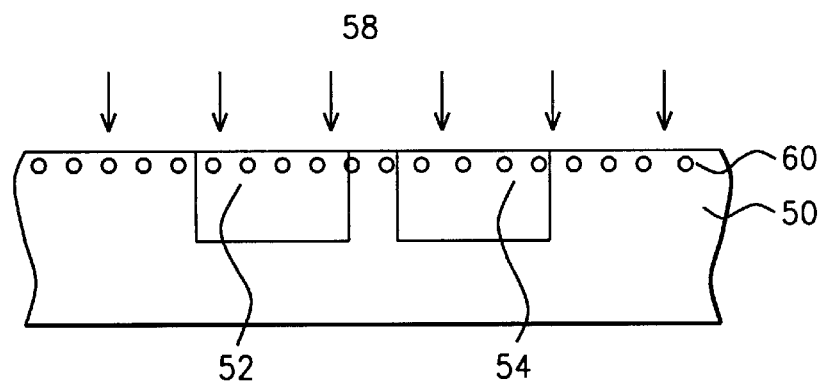
FIG. 5b shows the cross section of FIG. 5a after an As or $BF_2$ impurity implant has been performed

FIG. 5b shows the cross section of FIG. 5a after an As or BF2 impurity implant 58 has been performed in the surface of the substrate 50. The implanted impurity has penetrated over the layer 60 in the surface of the substrate.

Figure 5C:
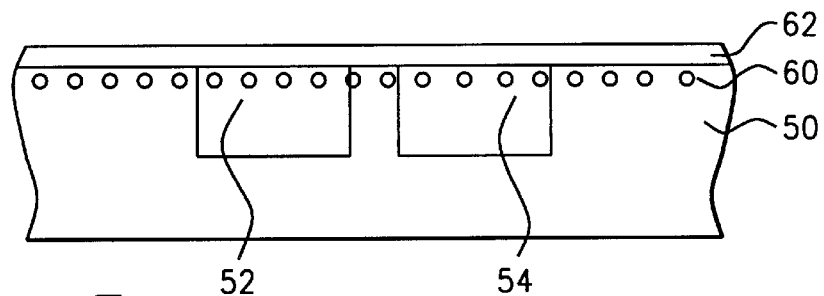
FIG. 5c shows the cross section after a layer of Ti has been deposited over the surface for the formation of silicided layers

FIG. 5c shows the cross section after a layer 62 of Ti has been deposited over the surface for the formation of silicided layers.

Figure 5D:
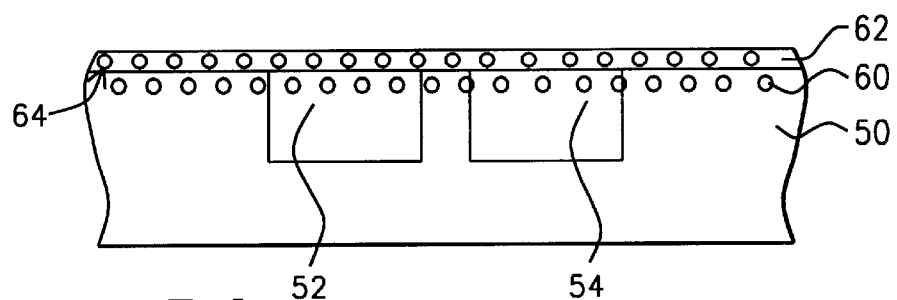
FIG. 5d shows the cross section of the process of silicon ion mixing in the surface

FIG. 5d shows the cross section of the process of ion mixing in the surface of the substrate 60, this ion mixing is a well-known phenomenon in the art and occurs spontaneously and in essence along the interface 64.

Figure 5E:
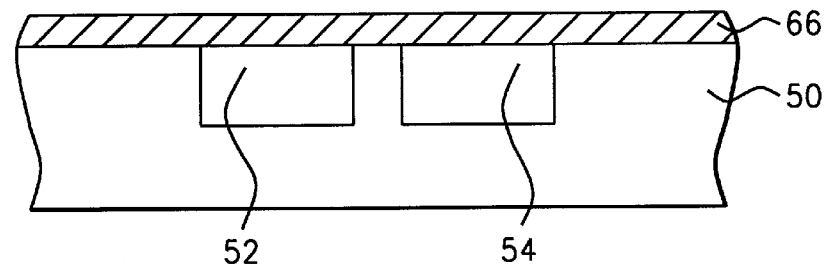
FIG. 5e shows the cross section after the first anneal of the surface.

FIG. 5e shows the cross-section after the first anneal of the surface of the substrate. This anneal has removed irregularities in impurity distributions that up to this point occurred between the deposited layer 62 of Ti and the implanted layer 60 of impurities, irregularities that were most pronounced along the plane of the interface 64 between these two layers 62 and 60. The (more uniform in lattice structure and ion distribution) layer 66 has been created in this manner. The preferred parameters for the heat treatment of the invention are a temperature of about 730 degrees C. applied for a time of about 30 seconds. This heat treatment not only accomplished the above highlighted affect of improving the internal structure of layer 66, the heat treatment also salicided the deposited layer 62 of Ti with the underlying surface of the silicon substrate 50. After this step of thermal anneal has been completed, the unreacted Ti can therefore be removed from the surface of the substrate after which the salicided layer of Ti is further improved by a second thermal anneal. The preferred parameters for the second heat treatment of the invention are a temperature of about 850 degrees C. applied for a time of about 30 seconds, this second thermal anneal converts the salicided Ti, that is the $TiSi_2$, to the C54 phase.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for manufacturing salicided regions for electrical contact to a semiconductor device, comprising the sequential steps of:

provliding a silicon semiconductor substrate having a surface whereby said substrate has been provided with a semiconductor device whereby said semiconductor device is a partially completed gate electrode structure;

depositing a layer of Resist Protection Oxide (RPO) over a surface of said substrate thereby including a surface of said partially completed gate electrode;

patterning and etching said layer of RPO thereby creating openings in said layer of RPO whereby said openings overlay and expose said regions where salicided regions need to be formed whereby said etch is an time-mode etch;

performing an impurity implant of arsenic (As) or boron (BF$_2$) into a surface of said substrate thereby including said exposed surfaces of said regions where salicided regions have to be created;

performing a pre-metal wet dip of said substrate; depositing a layer of titanium over a surface of said substrate thereby including said regions where salicided regions have to be created;

performing a silicon ion mixing implant into a surface of said substrate thereby including said regions where salicided regions have to be created;

performing a first Rapid Thermal Anneal of said surface of said substrate thereby forming reacted and unreacted titanium on said surface of said substrate;

removing said unreacted titanium from said surface of said substrate; and performing a second Rapid Thermal Anneal of said surface of said substrate.

2. The method of claim 1 whereby said partially completed gate electrode structure is contained in active regions in a surface of said substrate that have been defined by regions of field insulation in said surface of said substrate whereby furthermore:

a layer of gate oxide has been grown over said surface of said substrate;

a layer of polysilicon has been deposited over said surface of said layer of gate oxide;

said layer of polysilicon has been patterned and etched thereby forming a gate electrode layer of said gate electrode structure;

LDD regions have been formed in said surface of said substrate that are self-aligned with said gate electrode layer;

nitride spacers have been formed on sidewalls of said gate electrode layer; and source and drain regions have been formed in said surface of said substrate that are self-aligned with said gate electrode layer.

3. The method of claim 1 with an additional step of performing back-end processing for completion of said gate electrode structure.

4. The method of claim 3 wherein said performing back-end processing is:

depositing a layer of Inter Level Dielectric (ILD) over said surface of said substrate thereby including a surface of said gate electrode structure;

creating of contact openings in said layer of ILD whereby said contact openings overlay and align with said silicided regions;

depositing a layer of metal over a surface of said layer of ILD thereby including said openings created in said layer of ILD;

planarizing said layer of deposited metal; and patterning and etching said deposited layer of metal thereby establishing electrical contacts between electrical interconnect lines and said silicided regions.

5. The method of claim 1 wherein said depositing a layer of Resist Protection Oxide (RPO) is formed to a thickness of between about 100 and 200 Angstrom through a Chemical Vapor Deposition at a temperature of between about 350 and 450 degrees C. for a time period of about 10 to 20 seconds.

6. The method of claim 1 wherein said depositing a layer of titanium (Ti) over a surface of said gate electrode structure is depositing a layer of Ti to a thickness between about 200 and 600 Angstrom at a temperature of between about 25 to 300 degrees C. using either methods of (RF or DC) sputtering or of CVD deposition whereby a preferred method is a method of sputter deposition.

7. The method of claim 1 wherein said performing a first Rapid Thermal Anneal is applying to said substrate a temperature of between about 600 and 750 degrees C. for a time between about 10 and 40 seconds thereby causing said deposited titanium to be converted to silicide over those regions where said titanium is in direct contact with said silicon of said substrate.

8. The method of claim 1 wherein said removing unreacted titanium from a surface of said gate electrode structure is applying a selective etchant such as ammonium hydroxide and hydrogen peroxide in water thereby removing all unreacted titanium from said surface of said substrate.

9. The method of claim 1 wherein said performing a second Rapid Thermal Anneal is applying to said substrate a temperature of between about 800 and 1000 degrees C. for a time between about 10 and 40 seconds thereby causing said titanium silicide to change its crystal structure to a lower resistivity phase.

10. The method of claim 1 wherein said performing a impurity implant of arsenic (As) or boron ($BF_2$) is implanting As or $BF_2$ at an energy between about 5 to 50 KeV with a most preferred energy of 15 KeV and a dose between about 1E12 to 5E14 atoms/cm$^2$ with a most preferred dose at 1E14 atoms/cm$^2$.

11. A method for manufacturing titanium silicide regions for electrical contact to a semiconductor device, comprising the sequential steps of:

providing a silicon semiconductor substrate having a surface whereby said substrate has been provided with a semiconductor device whereby said semiconductor device is a partially completed gate electrode structure;

depositing a layer of Resist Protection Oxide (RPO) over a surface of said substrate thereby including a surface of said partially completed gate electrode;

patterning and etching said layer of RPO thereby creating openings in said layer of RPO whereby said openings overlay and expose said regions where salicided regions need to be formed whereby said etch is an time-mode etch;

performing an impurity implant of arsenic (As) or boron ($BF_2$) into said surface of said substrate thereby including said exposed surfaces of said regions where salicided regions have to be created;

performing a pre-metal wet dip of said substrate;

depositing a layer of titanium over said surface of said substrate thereby including said regions where titanium silicide regions have to be created;

performing a silicon ion mixing implant into said surface of said substrate thereby including said regions where titanium silicide regions have to be created;

performing a first Rapid Thermal Anneal of said surface of said substrate thereby forming reacted and unreacted titanium on said surface of said substrate;

removing said unreacted titanium from said surface of said substrate; and performing a second Rapid Thermal Anneal of said surface of said substrate.

12. The method of claim 11 whereby said partially completed gate electrode structure is contained in active regions in said surface of said substrate that have been defined by regions of field insulation in said surface of said substrate whereby furthermore:

a layer of gate oxide has been grown over said surface of said substrate;

a layer of polysilicon has been deposited over a surface of said layer of gate oxide;

said layer of polysilicon has been patterned and etched thereby forming a gate electrode layer of said gate electrode structure;

LDD regions have been formed in said surface of said substrate that are self-aligned with said gate electrode layer;

nitride spacers have been formed on sidewalls of said gate electrode layer; and source and drain regions have been formed in said surface of said substrate that are self-aligned with said gate electrode layer.

13. The method of claim 11 with an additional step of performing back-end processing for completion of said gate electrode structure.

14. The method of claim 13 wherein said performing back-end processing is:

depositing a layer of Inter Level Dielectric (ILD) over said surface of said substrate thereby including a surface of said gate electrode structure;

creating of contact openings in said layer of ILD whereby said contact openings overlay and align with said silicided regions;

depositing a layer of metal over a surface of said layer of ILD thereby including said openings created in said layer of ILD;

planarizing said layer of deposited metal; and patterning and etching said deposited layer of metal thereby establishing electrical contacts between electrical interconnect lines and said titanium silicide regions.

15. The method of claim 11 wherein said depositing a layer of Resist Protection Oxide (RPO) is formed to a thickness of between about 300 and 400 Angstrom through a Chemical Vapor Deposition at a temperature of between about 800 and 1000 degrees C. for a time period of about 10 to 20 seconds.

16. The method of claim 11 wherein said depositing a layer of polysilicon uses a furnace at a temperature between 400 and 600 degrees C. to a thickness between 1300 and 2300 Angstrom.

17. The method of claim 11 wherein said performing a first Rapid Thermal Anneal is applying to said substrate a temperature of between about 600 and 750 degrees C. for a time between about 10 and 40 seconds thereby causing said deposited polysilicon to be converted to titanium silicide over those regions where said polysilicon is in direct contact with said silicon of said substrate.

18. The method of claim 11 wherein said performing a second Rapid Thermal Anneal is applying to said substrate a temperature of between about 800 and 1000 degrees C. for a time between about 10 and 40 seconds thereby causing said titanium silicide to change its crystal structure to a lower resistivity phase.

19. The method of claim 11 wherein said performing a impurity implant of arsenic (As) or boron ($BF_2$) is implanting As or $BF_2$ at an energy between about 5 to 50 KeV with a most preferred energy of 15 KeV and a dose between about 1E12 to 5E14 atoms/$cm^2$ with a most preferred dose at 1E14 atoms/$cm^2$.

20. A method of forming a layer of $TiSi_x$ over a silicon surface, comprising the steps of:

providing a silicon surface whereby said silicon surface typically is but is not limited to a surface of a semiconductor substrate;

implanting a p-type impurity into said silicon surface;

implanting an n-type impurity into said silicon surface whereby said n-type implant is adjacent to said p-type implant whereby however said n-type implant is not necessarily immediately contiguous with said p-type implant;

performing a As or $BF_2$ implant into said silicon surface;

depositing a layer of refractory metal over said silicon surface;

performing a silicon ion implant into a surface of said layer of refractory metal;

performing a first thermal anneal of said layer of refractory metal thereby creating reacted and unreacted titanium;

removing said unreacted titanium from said silicon surface; and performing a second thermal anneal of said layer of refractory metal thereby transforming said reacted titanium from a high resistivity phase to a low resistivity phase.

21. The method of claim 20 whereby said refractory metal contains titanium.

22. The method of claim 20 whereby said refractory metal contains cobalt.

23. The method of claim 20 whereby said refractory metal contains nickel.

24. The method of claim 20 whereby said refractory metal contains tungsten.

25. The method of claim 20 wherein said performing a impurity implant of arsenic (As) or boron ($BF_2$) is implanting As or $BF_2$ at an energy between about 5 to 50 KeV with a most preferred energy of 15 KeV and a dose between about 1E12 to 5E14 atoms/$cm^2$ with a most preferred dose at 1E14 atoms/$cm^2$.

26. The method of claim 20 wherein said performing a first thermal anneal is applying a temperature between about 600 and 900 degrees C. for a time period between about 20 and 40 seconds to said layer of refractory metal.

27. The method of claim 20 wherein said performing a second thermal anneal is applying a temperature between about 700 and 1000 degrees C. for a time period between about 20 and 40 seconds to said reacted titanium.

* * * * *